(12) United States Patent
Lim et al.

(10) Patent No.: US 7,285,373 B2
(45) Date of Patent: Oct. 23, 2007

(54) POLYMER AND CHEMICALLY AMPLIFIED RESIST COMPOSITION CONTAINING THE SAME

(75) Inventors: Young-Taek Lim, Cheunan (KR); Joo-Hyeon Park, Cheunan (KR); Dong-Chul Seo, Cheunan (KR); Chang-Min Kim, Cheunan (KR); Seong-Duk Cho, Asan (KR); Hyun-Sang Joo, Asan (KR)

(73) Assignee: Korea Kumho Petrochemical Co., Ltd (KR)

(*) Notice: Subject to any disclaimer, the term of this patent is extended or adjusted under 35 U.S.C. 154(b) by 0 days.

(21) Appl. No.: 10/940,469

(22) Filed: Sep. 14, 2004

(65) Prior Publication Data

US 2005/0153236 A1   Jul. 14, 2005

(30) Foreign Application Priority Data

Jan. 14, 2004  (KR) ............... 10-2004-0002526

(51) Int. Cl.
   *G03F 7/039*   (2006.01)
(52) U.S. Cl. ............................ 430/273.1; 526/245
(58) Field of Classification Search ............... None
   See application file for complete search history.

(56) References Cited

U.S. PATENT DOCUMENTS

| | | | | | |
|---|---|---|---|---|---|
| 3,380,938 | A | * | 4/1968 | James et al. ............ | 524/523 |
| 3,697,494 | A | * | 10/1972 | Alsberg ............... | 428/220 |
| 3,999,834 | A | * | 12/1976 | Ohtomo et al. ......... | 385/124 |
| 4,028,482 | A | * | 6/1977 | Ueshima et al. ........ | 526/271 |
| 5,837,419 | A | * | 11/1998 | Ushirogouchi et al. .. | 430/270.1 |
| 6,593,440 | B2 | * | 7/2003 | Sen et al. .............. | 526/171 |
| 2001/0046641 | A1 | * | 11/2001 | Uetani et al. ........... | 430/270.1 |
| 2002/0009668 | A1 | * | 1/2002 | Nishimura et al. ...... | 430/270.1 |

OTHER PUBLICATIONS

Ito et al, Advances in Resit Technology and Processing XIX, Theodore H. Fedynyshyn, Ed, Proceedings of SPIE, vol. 4690 (2002 pp. 18-28.*
Crawford et al, "Single layer fluropolymer resists for 157-nm lithography", Proc. SPIE Int. Soc. Opt. Eng. vol. 5039, pp. 80-92, (Jun. 2003).*
Hung et al, "Resist materials for 157-nm microlithography: an update", Proceedings of SPIE—vol. 4345□□Advances in Resist Technology and Processing XVIII, Francis M. Houlihan, Editor, Aug. 2001, pp. 385-395.*
Reichmanis et al J. Vac. Sci. Technol. B 15 (6), Nov./Dec. 1997, pp. 2528-2533.*

* cited by examiner

*Primary Examiner*—Cynthia Hamilton
(74) *Attorney, Agent, or Firm*—Davidson, Davidson & Kappel, LLC

(57) ABSTRACT

A chemically amplified resist composition includes a novel polymer, a photoacid generator, and a solvent.

The chemically amplified resist can form a resist pattern that is excellent in adhesiveness with a low dependency to the substrate, transparency at the far ultraviolet wavelength range such as KrF Excimer laser or ArF Excimer laser, dry etch resistance, sensitivity, resolution, and developability. In addition, the polymer contains a maximum number of saturated aliphatic rings to enhance etching resistance, and additionally includes an alkoxyalkyl acrylate monomer introduced as a solution to the problem with the conventional polyacrylate resist in regard to edge roughness of the pattern, to form a uniform edge of the pattern because the alkylalcohol compound generated together with a formaldehyde and a carboxylate compound by a deprotection reaction of the alkoxyalkyl acrylate monomer with an acid acts as a solvent or an antifoaming agent in the pattern.

5 Claims, 8 Drawing Sheets

< Run Conditions >
System: T60 + External RI
Columns: Tosoh2500+4000
Solvent: THF
Flow Rate: 1.000 mL/min
Concentration: 0.000 mg/mL
Inj. Vol.: 100.0 uL
Analyst: Dong Chul Seo < GPC Data Summary >
Mn: 3,530        Pd: 1.76
Mw: 6,200
Mz: 9,940
% Below 350:           0.0
% Above 2,500:        77.8

POLYMER AND CHEMICALLY AMPLIFIED RESIST COMPOSITION CONTAINING THE SAME

BACKGROUND OF THE INVENTION

1. The Field of the Invention

This invention relates to a novel polymer composition and a resist composition containing the same. More particularly, this invention relates to a novel polymer applicable to the fabrication of a resist composition useful for MEMS (Micro Electro Mechanical Systems) using a variety of radiations, including far-infrared radiation (e.g., KrF Excimer laser, ArF Excimer laser, $F_2$ Excimer laser, etc.), X-ray (e.g., synchrotron radiation), and charged particle beams (e.g., e-beam), and a resist composition containing the polymer.

2. Related Prior Art

With the progress of high-integration semiconductor devices, there has been a demand for an extra fine pattern of less than 0.2 micron in the manufacture of very LSI (Large-Scale Integration, VLSI) semiconductor products. Hence, the exposure wavelength becomes much shorter than the wavelength of the conventional radiations, such as g- or i-beam, and researches on the lithography using far-ultraviolet radiation, KrF Excimer laser, ArF Excimer laser, $F_2$ Excimer laser, X-ray, and e-beam have recently drawn considerable attention. The light sources most spotlighted in the next-generation lithography requiring a pattern of less than 0.10 micron are ArF Excimer laser and $F_2$ Excimer laser.

The resist composition includes a component having an acid-liable function (hereinafter, referred to as "polymer"), a component generating acids under irradiation (hereinafter, referred to as "photoacid generator"), a solvent, and in some cases, a dissolution inhibitor, or a basic additive.

The polymer used as a principal ingredient of the resist composition is supposed to minimize the light absorption at the exposure wavelength. The chemically amplified resists conventionally used for the ArF Excimer laser that mostly include an acryl-based polymer as a principal ingredient are poor in dry plasma etching resistance due to an excess of oxygen atoms in the polymer. The reason is because the increase in the thickness of the resist pattern, which is required in compensating for the poor etching resistance, makes it difficult to mount the resist pattern upward stably on the substrate.

In an attempt to solve this problem, some resins containing a large number of alicyclic olefin groups have been exploited as a polymer used for the resists for ArF Excimer laser or $F_2$ Excimer laser. Specific examples of the resin are an acrylate polymer containing isobornyl groups or adamantanyl groups, an olefin polymer comprising pure norbornene derivatives, maleic anhydride-cycloolefin polymer, etc.

More specifically, the acrylate polymer includes the polymer containing alicyclic groups disclosed in SPIE (1996, 2724, 334), and the maleic anhydride-cycloolefin polymer includes the polymer disclosed in SPIE (1996, 2724, 355).

The acrylate polymer shows a low light absorption, but it is inferior in etching resistance to aromatic compounds.

The maleic anhydride-cycloolefin polymer is superior in etching resistance to the acrylate polymer but inferior in verticality of the pattern due to its high light absorption at ArF Excimer laser wavelengths. In addition, the maleic anhydride monomer, which is liable to hydrolysis with water, results in poor storage stability of the resist prepared.

The polymer of the pure norbornene derivative demands the use of a metal catalyst, and its polymerized resin is too hard to exhibit excellent properties as a resist ingredient.

To solve this problem, a copolymer of acrylate polymer and olefin is prepared. An example of the preparation method includes substituting an olefin with a halogen compound or an electron-withdrawing group (e.g, such as halogen, nitrile, or trifluoromethyl), and synthesizing the corresponding polymer, as illustrated in the following Scheme 1. Another method includes introducing a functional group such as trifluoromethyl at the alpha-position of acrylate, and synthesizing the copolymer with olefin. The synthesis can be expressed as the following Scheme 2.

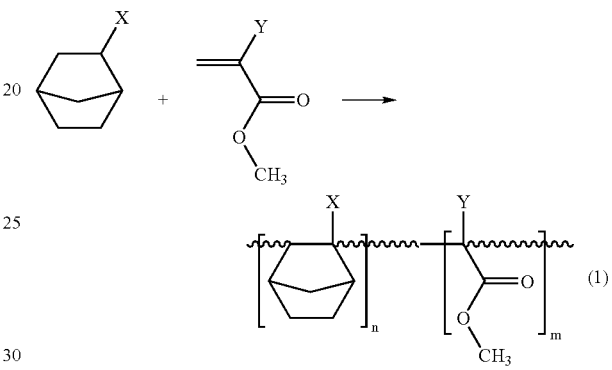

In the Scheme 1, X is halogen, or nitrile group (—CN); Y is hydrogen, or methyl; and n and m denote the repeat unit of the monomers.

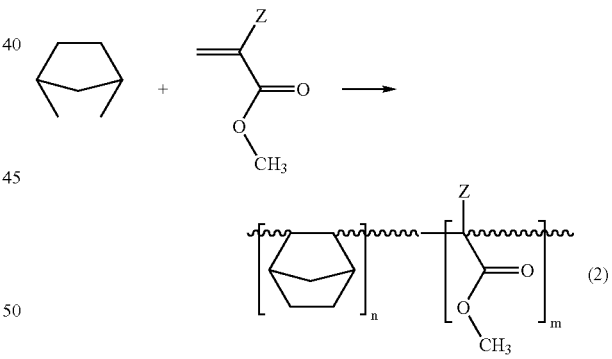

In the Scheme 2, Z is trifluoromethyl or nitrile group (—CN); n and m denote the repeat unit of the monomers.

The Scheme 1 shows an example of the reaction that introduces a halogen atom or a nitrile group to an olefin so as to enhance the radical reactivity of the olefin. The Scheme 2 shows an example of the reaction that introduces a substituent at an alpha-position of the acrylate to activate the copolymerization reaction of olefin and acrylate.

As described above, the preparation of a copolymer from an acrylate and an olefin necessarily demands the introduction of functional groups for enhancing the radical reactivity to the acrylate or the olefin, causing a deterioration of the solubility in a general solvent due to the introduced functional group. In addition, the use of the copolymer obtained by introducing such functional groups for a resist composition results in a deterioration of resolution and an increase in the energy required for pattern resolution (i.e., deterioration of sensitivity).

SUMMARY OF THE INVENTION

In an attempt to exploit a novel copolymer of olefin and acrylate, the inventors of the present invention has developed a polymer prepared by introducing an olefin having no functional group to an acrylate so as to enhance etching resistance, solubility in general solvents, an coating properties after the fabrication of a resist.

It is therefore an object of the present invention to provide a polymer necessary to the preparation of a resist pattern excellent in adhesiveness with a low dependency to the substrate, resistance to etching, transparency at this wavelength range, sensitivity, resolution, and developability.

It is another object of the present invention to provide a resist composition containing the polymer.

To achieve the objects of the present invention, there is provided a polymer represented by the following Formula 1:

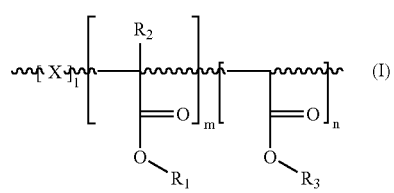

Formula 1

In the Formula 1, X is a $C_3$-$C_{30}$ vinyl ether derivative, a $C_3$-$C_{30}$ styrene derivative, a $C_3$-$C_{30}$ maleic anhydride derivative, or a $C_3$-$C_{30}$ olefin derivative not having an electron withdrawing group such as a halogen group, a nitrile group (—CN), a intro group (—$NO_2$), a trifluoromethyl group (—$CF_3$) or a sulfon group (—$SO_2$) at a double-bond position; $R_1$ and $R_3$ are independently hydrogen, $C_1$-$C_{30}$ alkyl, $C_1$-$C_{30}$ alkoxyalkyl, $C_1$-$C_{30}$ halogen-substituted alkyl, or $C_1$-$C_{30}$halogen-substituted alkoxyalkyl; $R_2$ is hydrogen, methyl, or trifluoromethyl; and l, m and n are a repeat unit of the polymer, wherein l is from 0.05 to 0.7, m is from 0.2 to 0.7, n is from 0 to 0.7, and l+m+n=100%.

In another aspect of the present invention, there is provided a chemically amplified resist composition that includes the polymer represented by the Formula 1, a photoacid generator, and a solvent.

The polymer of the present invention as represented by the Formula 1 has a repeat unit of acrylate and olefin monomers. In some cases, the polymer can be synthesized from a vinyl ether derivative, a maleic anhydride derivative, or a styrene derivative, instead of the olefin monomer.

The polymer obtained in the present invention is usually non-soluble or insoluble in an aqueous alkali solution or, in some cases, soluble in an aqueous alkali solution.

The polymer has an acid-labile functional group on its side chain or, in some cases, does not have any acid-labile functional groups.

The solubility is variable depending upon the type and the content of the monomers in the polymer.

Generally, the solubility of the polymer in an aqueous alkali solution decreases with an increase in the number of hydrophobic groups. The resist composition including such a polymer prepared by controlling the type and the content of the monomers is excellent in adhesiveness to substrate, independence to substrate, sensitivity, and resolution.

It is known that the olefin-acrylate copolymer represented by the Formula 1 cannot be prepared by general polymerization methods. But, the reactivity varies depending on the type of the acrylate derivative. For example, norbornene hardly reacts with methyl methacrylate but actively reacts with methyl acrylate.

In copolymerization of norbornene and acrylate, the contents of norbornene and methyl acrylate vary depending on the polymerization method employed. More specifically, the use of an excess of norbornene (more than twice the mole ratio of acrylate) increases the content of norbornene in the copolymer, and the conversion of norbornene increases through a polymerization method of slowly adding acrylate dropwise to the reaction mixture. Preferably, the required time for adding acrylate dropwise is in the range from 2 to 6 hours. The added amount of norbornene is greater in the polymerization method of adding acrylate dropwise rather than in other polymerization methods.

Furthermore, the reactivity of a three-membered copolymer of norbornene, methyl methacrylate, and methyl acrylate varies depending on the ratio of methyl acrylate to methyl methacrylate. This is because norbornene does not react with methyl methacrylate but actively reacts with methyl acrylate, which is highly reactive to methyl methacrylate. The relationship can be expressed as the following Scheme 3.

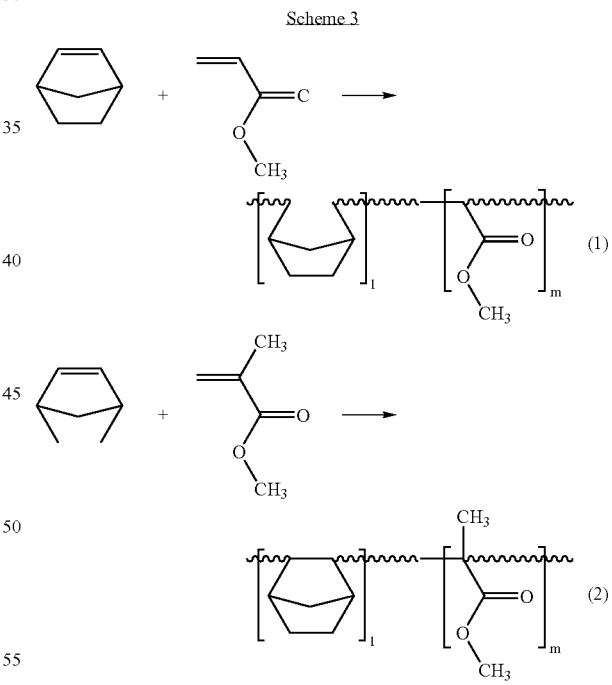

Scheme 3

In the Scheme 3, the repeat unit "l" of the norbornene monomer in the step (1) can be enhanced by up to 60% depending on the polymerization method, whereas the repeat unit "l'" of the norbornene monomer in the step (2) cannot be raised by more than 10%.

The polymer of the present invention can have its substituents substituted with fluorine atoms so as to be suitable to a resist for $F_2$ (157 nm) Excimer laser. The absorption of light at 157 nm decreases with an increase in the number of fluorine substituents.

The specific examples of the monomers available in the preparation of the polymer of the present invention include, if not specifically limited to, an olefin monomer such as norbornene, norbornene t-butyl carbonate, 1,1'-di(trifluoromethyl)-2-norbornyl-1-ol, a styrene monomer, 1,4-cyclohexyl vinyl ether, or 1,4-cyclohexane dimethanol vinyl ether; or an acrylate monomer such as acrylic acid, methyl acrylate, cyclohexyl methoxy acrylate, t-butyl cyclohexyl methoxy acrylate, isobornyl acrylate, 1-methyl cyclopentanyl acrylate, 3-bicyclo[2,2,1]hept-5-en-2-yl-hydroxy-propionate t-butyl ester, or isopropyl acrylate.

The content of each monomer is not specifically limited. But, the content of the monomer having a repeat unit l of the Formula 1, such as the olefin monomer or the styrene monomer is preferably at least 5 wt. % with respect to the total weight of the monomers. This is because the etching resistance remarkably deteriorates with the content of the monomer being less than 5 wt. %.

The polymer of the present invention obtained from such monomers can be a block copolymer, a random copolymer, or a graft copolymer.

The preparation of the polymer represented by the Formula 1 according to the present invention can be performed by a general method, but preferably by a radial polymerization reaction. The specific examples of the radical polymerization initiator as used herein include, if not specifically limited to, azobisisobutyronitrile (AIBN), benzoyl peroxide (BPO), lauryl peroxide, azobiscapronitrile, azobisisovaleronitrile, or tert-butyl hydro peroxide.

The polymerization reaction as used herein includes a solid polymerization, a solution polymerization, a solid-suspension polymerization, or an emulsion polymerization. The specific examples of a polymerization solvent as used herein include at least one selected from benzene, toluene, xylene, halogenated benzene, diethylether, tetrahydrofuran, esters, lactones, ketones, or amides.

The polymerization temperature is adequately controlled depending on the type of the catalyst employed and, preferably in the range of 60 to 100° C.

The molecular weight distribution of a polymer can be adequately controlled by varying the used amount of the polymerization initiator and the reaction time. Preferably, the unreacted monomers and byproducts remaining in the reaction mixture are removed by solvent-based precipitation.

The polystyrene-reduced weight average molecular weight (hereinafter, referred to as "Mw") as measured by gel permeation chromatography (GPC) of the polymer of the Formula 1 is typically in the range of 2,000 to 1,000,000, preferably 3,000 to 50,000 in consideration of sensitivity, developability, coatibility and heat resistance as a photoresist. The molecular weight distribution of the polymer is preferably in the range of 1.0 to 5.0, more preferably 1.0 to 3.0.

The polymer is used to prepare a chemically amplified resist composition. The content of the polymer in the chemically amplified resist composition is preferably at least 3 wt. %.

The chemically amplified resist composition of the present invention includes a photoacid generator. The specific examples of the photoacid generator as used herein include onium salts such as iodonium salts, sulfonium salts, phosphonium salts, diazonium salts, or pyridinium salts, and amides. Among theses salts, the sulfonium salt represented by the following Formula 2 or 3 is most preferred.

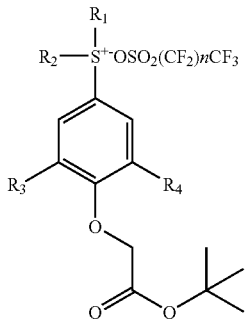

Formula 2

In the Formula 2, $R_1$ and $R_2$ are independently alkyl, aryl, perfluoroalkyl, benzyl, or allyl; $R_3$ and $R_4$ are independently hydrogen, alkyl, halogen, alkoxy, aryl, thiophenoxy, thioalkoxy, or alkoxycarbonylmethoxy; and n is an integer from 1 to 8.

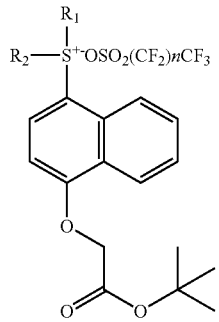

Formula 3

In the Formula 3, $R_1$ and $R_2$ are independently alkyl, aryl, perfluoroalkyl, benzyl, or allyl; and n is an integer from 1 to 8.

The used amount of the photoacid generator is, based on 100 parts by weight of the polymer, in the range of 0.1 to 30 parts by weight, preferably 0.3 to 10 parts by weight. These photoacid generators can be used alone or in combination of at least two of them.

If necessary, the chemically amplified resist composition of the present invention includes a compound that is decomposed by an acid to accelerate dissolution. The specific examples of the compound decomposed by an acid to accelerate dissolution include an alicyclic derivative having acid-liable groups, such as tert-butyl ester, or alkoxyalkanyl ester. The used amount of the additive in the preparation of a resist is, based on 100 parts by weight of the polymer, in the range of 2 to 6 parts by weight, preferably 5 to 40 parts by weight.

In addition, the resist composition of the present invention includes additives such as a surfactant, an anti-halation agent, an adhesive adjuvant, a preservative stabilizer, an antifoaming agent, etc. The resist composition of the present invention can also include a basic compound used for protecting the spread of acids generate after an exposure. The basic compound must be used in an adequate amount depending on its basicity, since the sensitivity deteriorates with an increase in the used amount of the basic compound. The used amount of the basic compound is preferably, based on 100 parts by weight of the polymer, in the range of 0.01 to 5 parts by weight.

The resist composition of the present invention is dissolved in a solvent having an adequate evaluation rate and an adequate viscosity so as to provide a uniform and even-surface coating layer. The specific examples of the solvent having such properties include ethylene glycol monomethyl ether, ethylene glycol monoethyl ether, ethylene glycol monopropyl ether, methyl celosolve acetate, ethyl celosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, gamma-butyrolactone, etc. In some cases, these solvents can be used alone or in combination of at least two of them. The used amount of the solvent is controlled depending on the properties of the solvent, such as volatility, viscosity, or the like so as to provide a uniform coating of the resist composition on a wafer.

The resist composition of the present invention is prepared in the form of a solution, coated on a wafer substrate, and dried to form a resist coating film. The method of coating the composition on the substrate includes filtering the resist solution, and coating the filtered solution on the substrate by spin coating, flow coating, or roll coating.

The resist coating formed by the above-mentioned method is partly subjected to irradiation to form a fine pattern. The radiation as used herein is selected depending on the type of the photoacid generator and specifically includes UV radiation (e.g., i-beam), far-ultraviolet radiation (e.g., KrF Excimer laser, ArF Excimer laser, or $F_2$ Excimer laser), X-ray, or charged particle beam (e.g., e-beam).

The specific examples of the developing solution as used for development include aqueous solutions of sodium hydroxide, potassium hydroxide, sodium carbonate, sodium silicate, sodium methane silicate, ammonia, ethylamine, n-propylamine, triethylamine, tetramethylammonium hydroxide, or tetraethylammonium hydroxide. Among these developing solutions, the aqueous solutions of tetramethylammonium hydroxide is most preferred. If necessary, additives such as a surfactant or an aqueous alcohol can be used.

DETAILED DESCRIPTION OF THE INVENTION

Now, the present invention will be described in further detail by way of the following Examples, which are not intended to limit the scope of the present invention.

SYNTHESIS EXAMPLE 1

Figure 1:
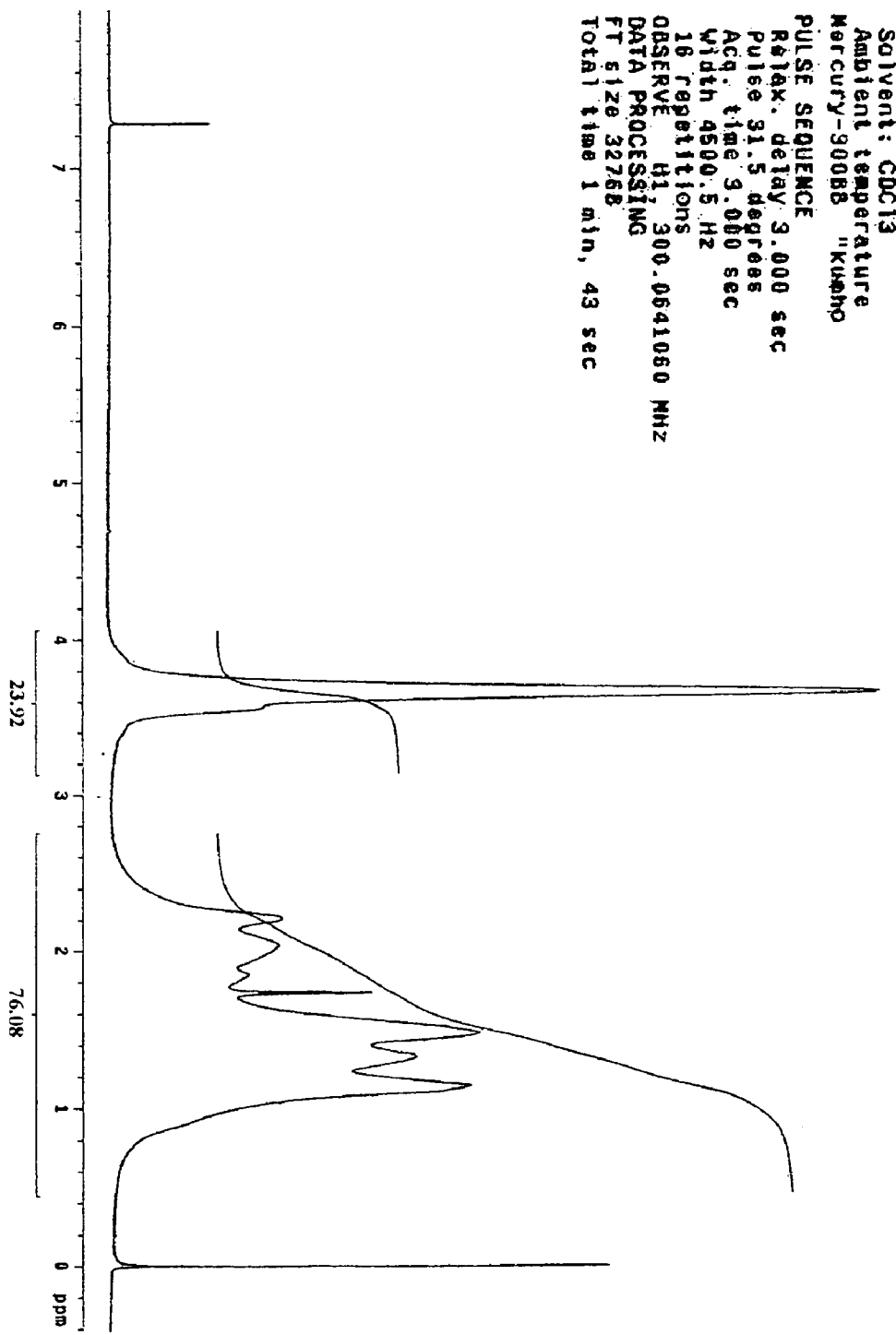
FIG. 1 is a $^1$H-NMR spectrum of the compound represented by the Formula 4.
Figure 2:
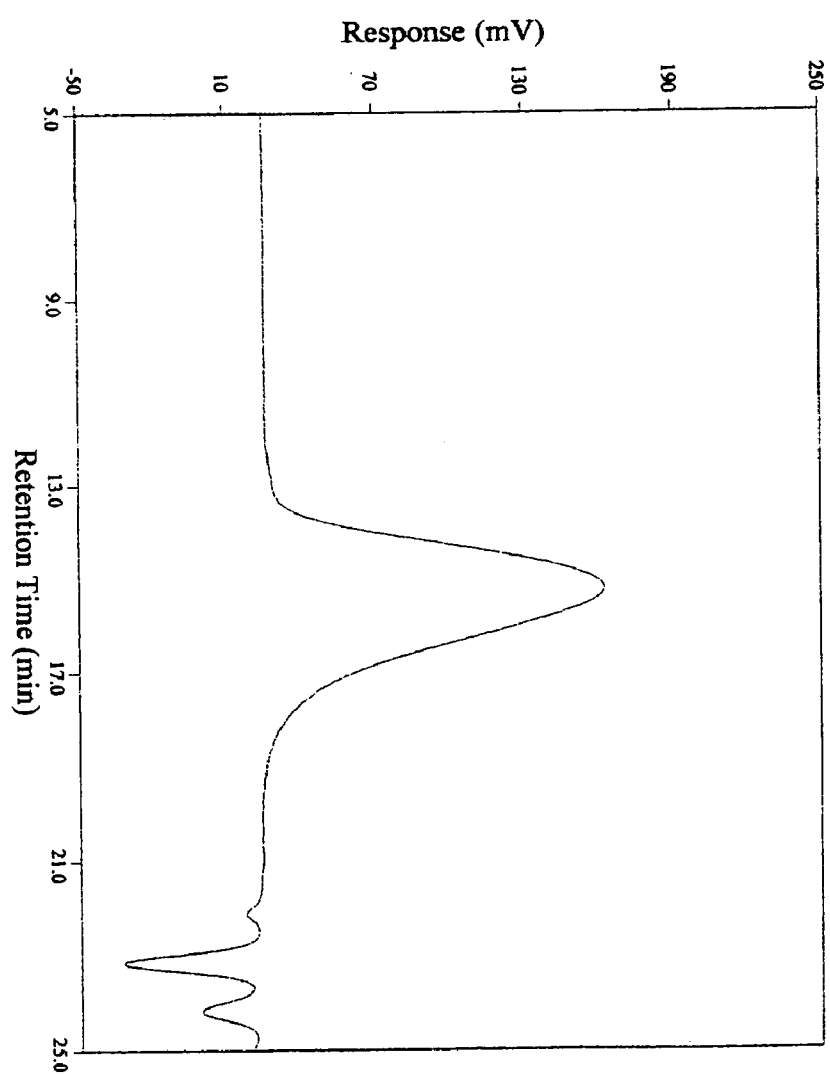
FIG. 2 is a GPC of the compound represented by the Formula 4.

44 g of norbornene and 2.6 g of dimethyl azobisisobutylate used as an initiator, together with 68 g of ethyl acetate were added to a reaction flask. The air in the flask was replaced with nitrogen gas, and the flask was heated to have its inner temperature raised to 70° C. At the inner temperature of 70° C., 10 g of methyl acrylate was slowly added dropwise with a syringe pump for 2 hours. After an 8-hour reaction at this temperature, the reaction mixture was added dropwise to 1.2 L of hexane. The precipitate thus obtained was filtered under vacuum and dried in a vacuum oven at 70° C. to obtain a polymer represented by the following Formula 4. The polymer thus obtained was analyzed in regard to its structure and substitution by $^1$H-NMR. The result is presented in FIG. 1. In addition, the molecular weight of the polymer was determined by GPC, of which the result is presented in FIG. 2.

Yield: 15 g;

Weight average molecular weight: 6,720;

Molecular weight distribution: 1.63;

Substitution analysis by $^1$H-NMR: l=0.3 95, m=0.605

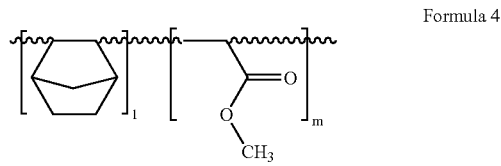

Formula 4

SYNTHESIS EXAMPLE 2

Figure 3:
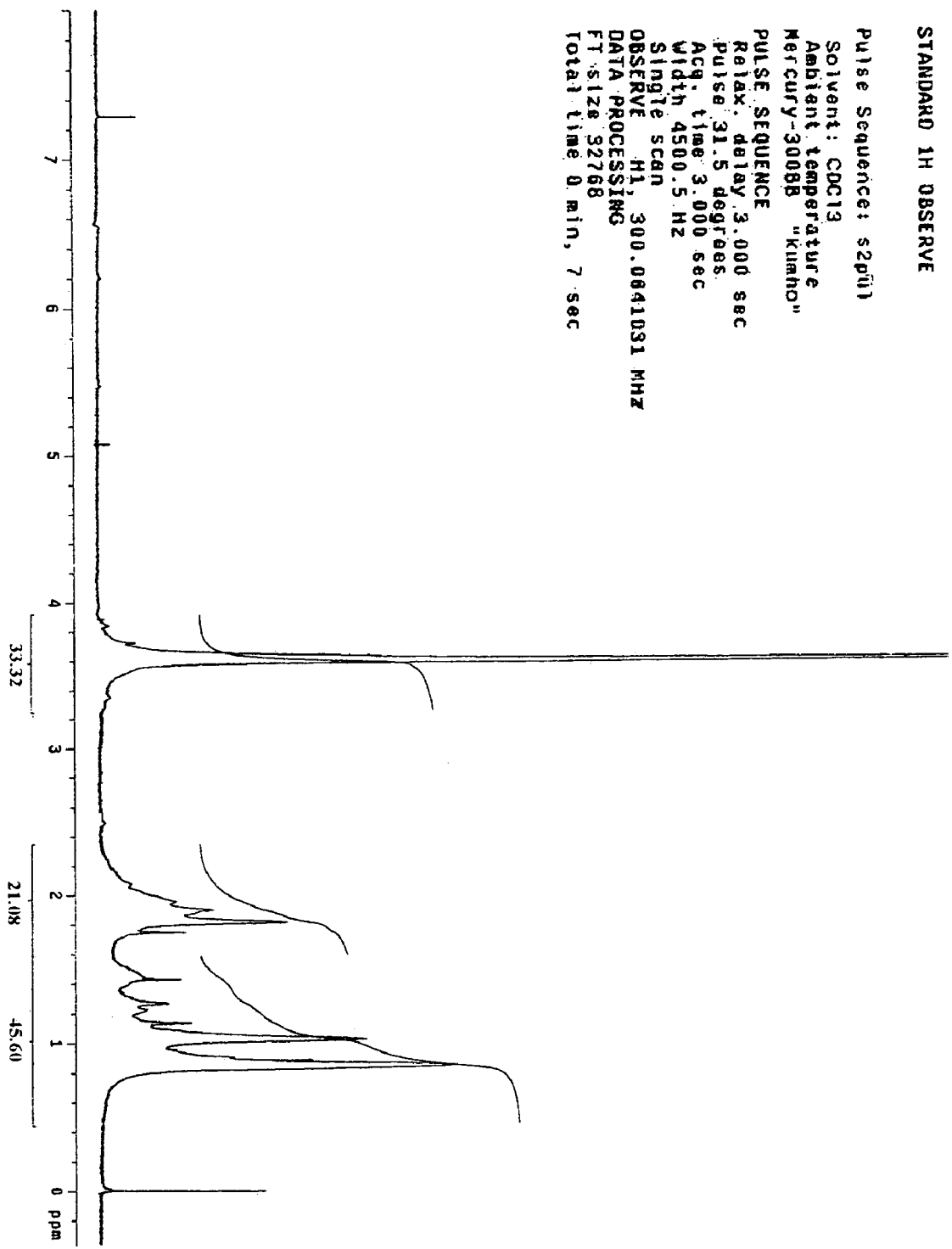
FIG. 3 is a $^1$H-NMR spectrum of the compound represented by the Formula 5.
Figure 4:
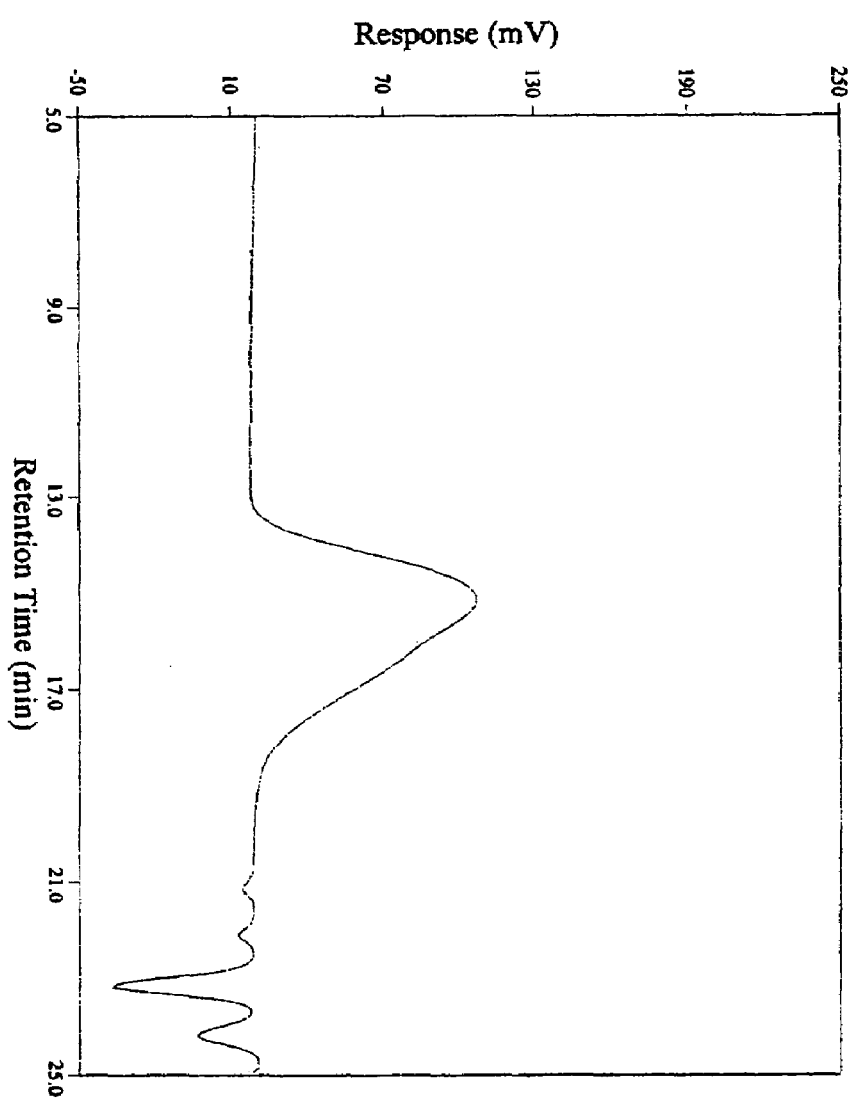
FIG. 4 is a GPC of the compound represented by the Formula 5.

44 g of norbornene and 2.6 g of dimethyl azobisisobutylate used as an initiator, together with 68 g of ethyl acetate were added to a reaction flask. The air in the flask was replaced with nitrogen gas, and the flask was heated to have its inner temperature raised to 70° C. At the inner temperature of 70° C., 11.6 g of methyl methacrylate was slowly added dropwise with a syringe pump for 2 hours. After an 8-hour reaction at this temperature, the reaction mixture was added dropwise to 1.2 L of hexane. The precipitate thus obtained was filtered under vacuum and dried in a vacuum oven at 70° C. to obtain a polymer represented by the following Formula 5. The polymer thus obtained was analyzed in regard to its structure and substitution by $^1$H-NMR. The result is presented in FIG. 3. In addition, the molecular weight of the polymer was determined by GPC, of which the result is presented in FIG. 4.

Yield: 15 g;

Weight average molecular weight: 6,200;

Molecular weight distribution: 1.76;

Substitution analysis by $^1$H-NMR: l'=0.091, m'=0.909

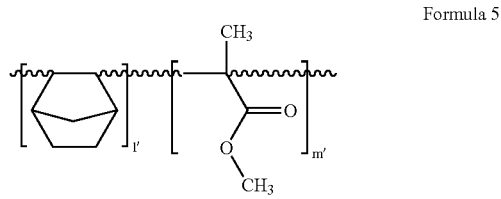

Formula 5

SYNTHESIS EXAMPLE 3

The producers were performed in the same manner as described in the Synthesis Example 1, excepting that 21.4 g of cyclohexyl methoxy acrylate was used instead of methyl acrylate. The final product was a polymer represented by the following Formula 6. The polymer thus obtained was analyzed in regard to its structure and substitution by $^1$H-NMR and in regard to its molecular weight by GPC.

Yield: 24.3 g;
Weight average molecular weight: 6,050;
Molecular weight distribution: 1.69;
Substitution analysis by $^1$H-NMR: l=0.41, m=0.59

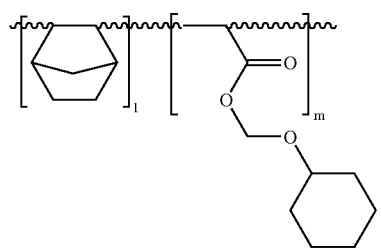

Formula 6

SYNTHESIS EXAMPLE 4

The producers were performed in the same manner as described in the Synthesis Example 1, excepting that 27.8 g of t-butyl cyclohexyl methoxy acrylate was used instead of methyl acrylate. The final product was a polymer represented by the following Formula 7. The polymer thus obtained was analyzed in regard to its structure and substitution by $^1$H-NMR and in regard to its molecular weight by GPC.

Yield: 28 g;
Weight average molecular weight: 6,800;
Molecular weight distribution: 1.8;
Substitution analysis by $^1$H-NMR: l=0.38, m 0.62

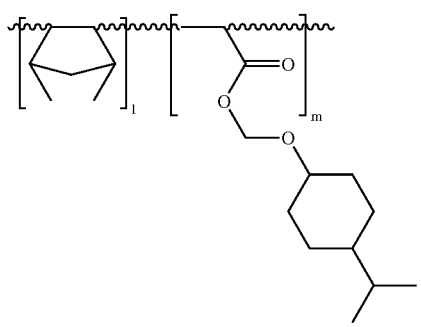

Formula 7

SYNTHESIS EXAMPLE 5

The producers were performed in the same manner as described in the Synthesis Example 1, excepting that 21.4 g of isobornyl acrylate was used instead of methyl acrylate. The final product was a polymer represented by the following Formula 8. The polymer thus obtained was analyzed in regard to its structure and substitution by $^1$H-NMR and in regard to its molecular weight by GPC.

Yield: 26 g;
Weight average molecular weight: 5,080;
Molecular weight distribution: 1.6;
Substitution analysis by $^1$H-NMR: l=0.29, m=0.71

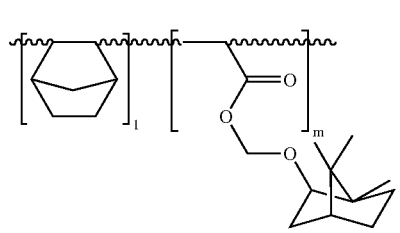

Formula 8

SYNTHESIS EXAMPLE 6

Figure 5:
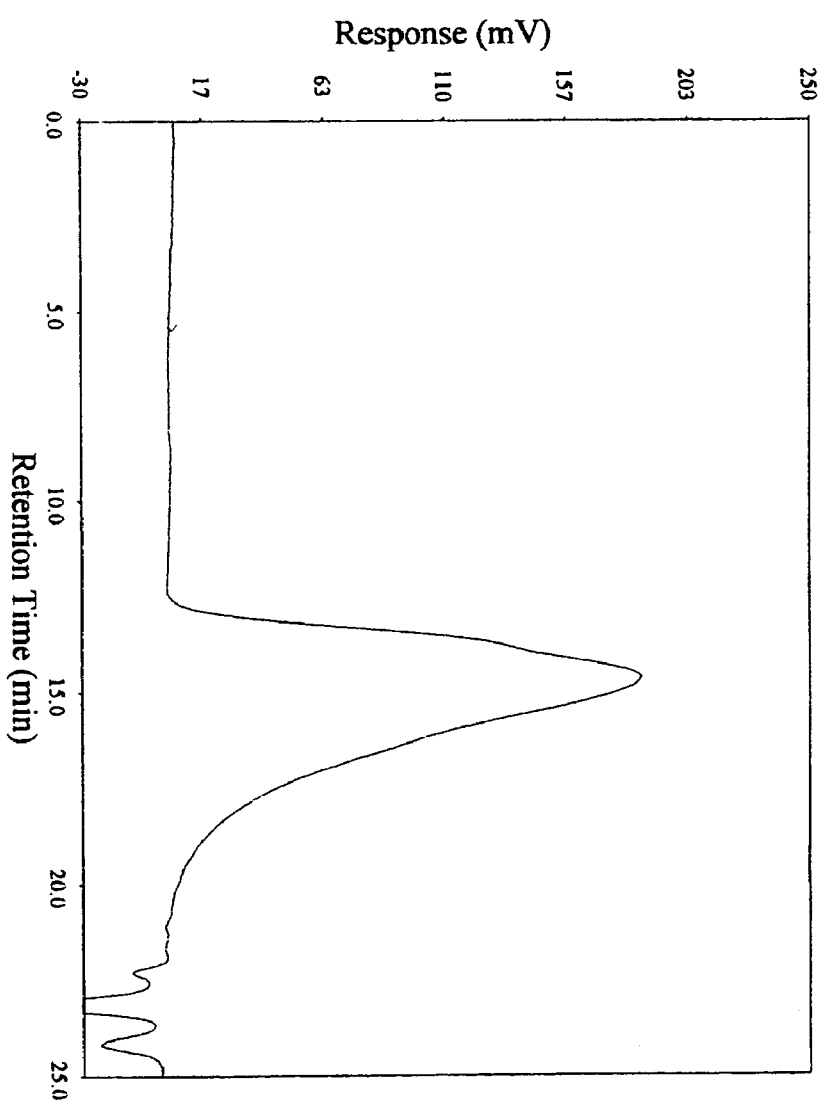
FIG. 5 is a GPC of the compound represented by the Formula 9.

The producers were performed in the same manner as described in the Synthesis Example 1, excepting that 40 g of t-butyl acrylate and 5.6 g of acrylic acid were used instead of methyl acrylate. The final product was a polymer represented by the following Formula 9. The polymer thus obtained was analyzed in regard to its structure and substitution by $^1$H-NMR and in regard to its molecular weight by GPC. The results are presented in FIG. 5.

Yield: 55 g;
Weight average molecular weight: 12,300;
Molecular weight distribution: 2.89;
Substitution analysis by $^1$H-NMR: l=0.45, m=0.45, n=0.15

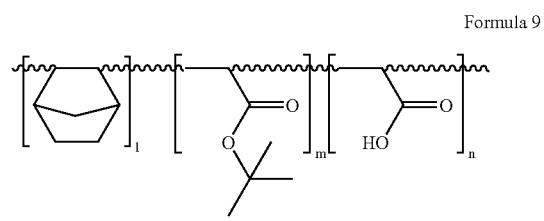

Formula 9

SYNTHESIS EXAMPLE 7

Figure 6:
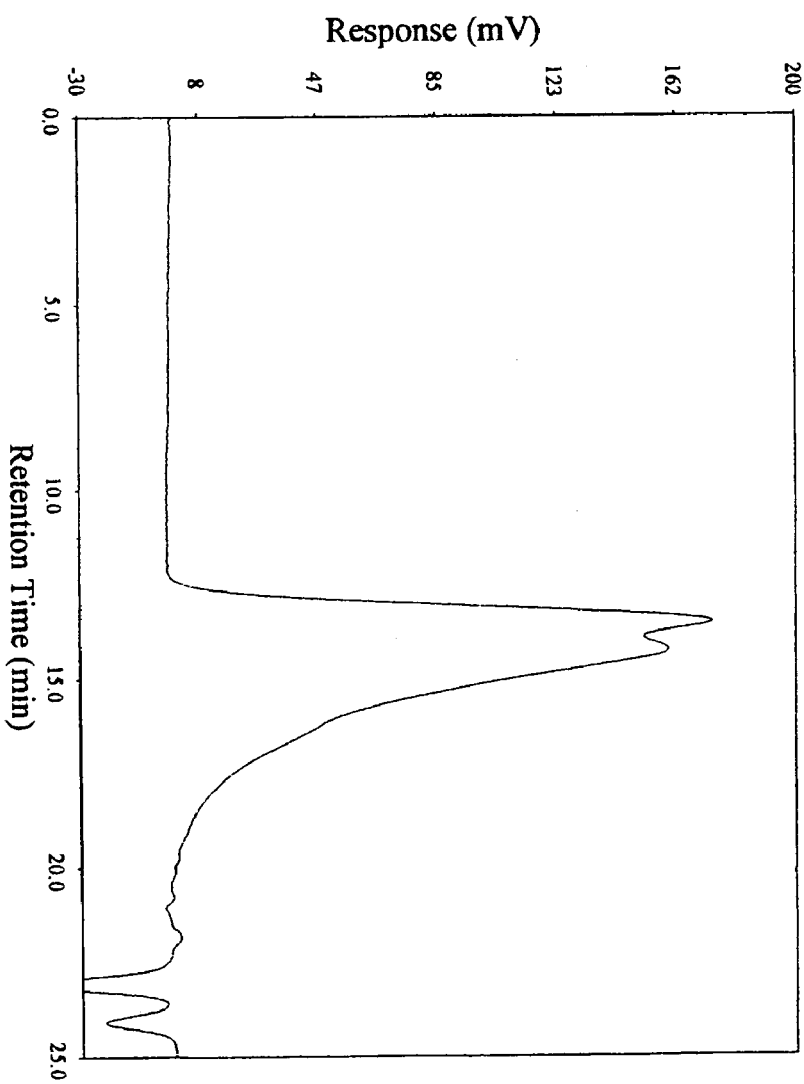
FIG. 6 is a GPC of the compound represented by the Formula 10.

20 g of the polymer obtained in the Synthesis Example 6, 20 g of cyclohexene oxide, and 0.6 g of 4-dimethyl amino pyridine used as a basic catalyst were dissolved in 200 ml of ethyl acetate in a reaction flask. As the reaction temperature reaches 70° C., the reaction solution was stirred for 6 hours. The reaction solution was precipitated in hexane, filtered under vacuum, and dried in a vacuum oven at 70° C. for 16 hours to obtain a polymer represented by the following Formula 10. The polymer thus obtained was analyzed in regard to its structure and substitution $^1$H-NMR, and in regard to its molecular weight by GPC. The result is presented in FIG. 6.

Yield: 57 g;
Weight average molecular weight: 20,600;
Molecular weight distribution: 3.25;
Substitution analysis by $^1$H-NMR: l=0.19, m=0.46, n=0.35

Formula 10

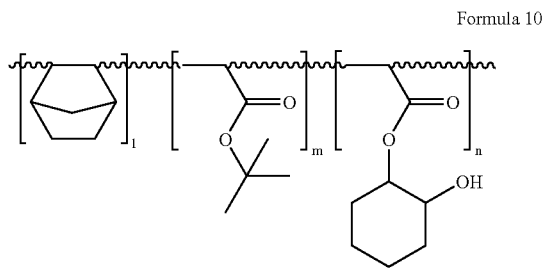

SYNTHESIS EXAMPLE 8

Figure 7:
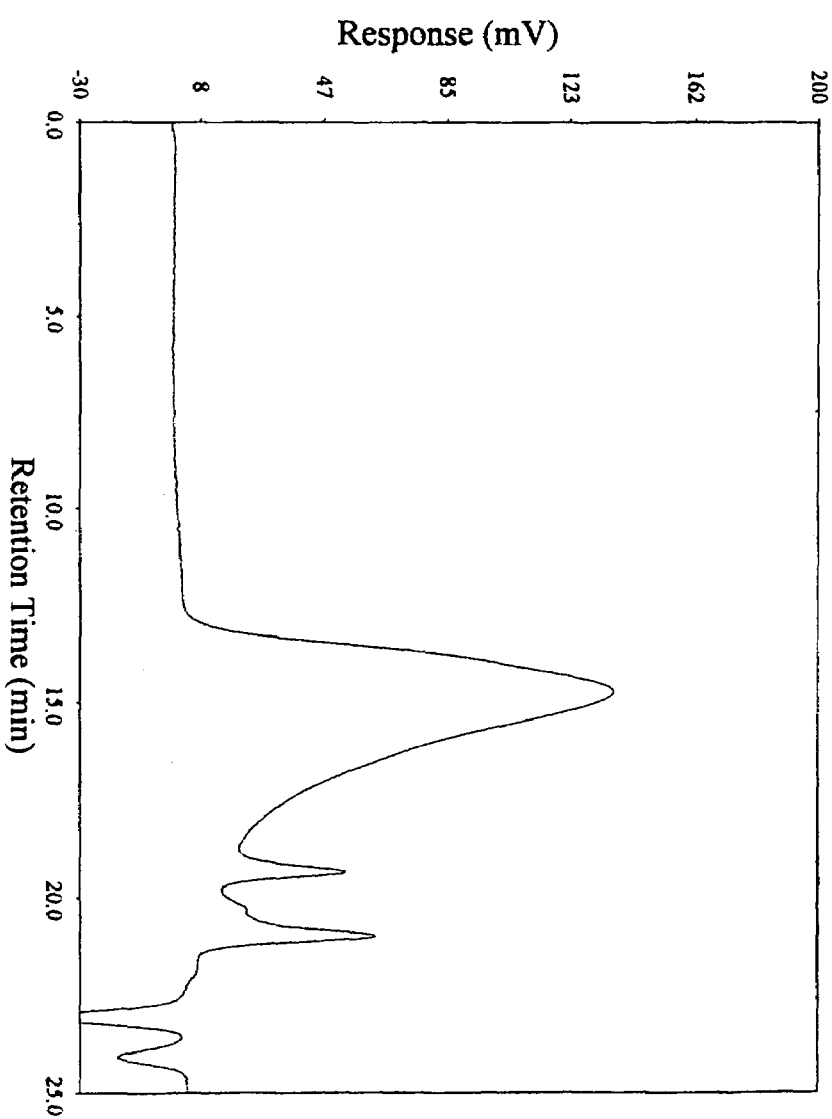
FIG. 7 is a GPC of the compound represented by the Formula 11.

The producers were performed in the same manner as described in the Synthesis Example 1, excepting that 50 g of t-butyl cyclohexyl methoxy acrylate and 15 g of acrylic acid were used instead of methyl acrylate. The final product was a polymer represented by the following Formula 11. The polymer thus obtained was analyzed in regard to its structure and substitution by $^1$H-NMR and in regard to its molecular weight by GPC. The results are presented in FIG. 7.

Yield: 45 g;
Weight average molecular weight: 11,600;
Molecular weight distribution: 2.05;
Substitution analysis by $^1$H-NMR: l=0.46, m=0.27, n=0.27

Formula 11

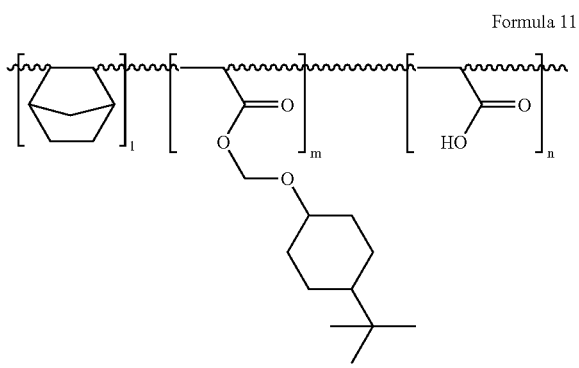

SYNTHESIS EXAMPLE 9

20 g of the polymer obtained in the Synthesis Example 8, 20 g of cyclohexene oxide, and 0.6 g of 4-dimethyl amino pyridine used as a basic catalyst were dissolved in 200 ml of ethyl acetate in a reaction flask. As the reaction temperature reaches 70° C., the reaction solution was stirred for 6 hours. The reaction solution was precipitated in hexane, filtered under vacuum, and dried in a vacuum oven at 70° C. for 16 hours to obtain a polymer represented by the following Formula 12. The polymer thus obtained was analyzed in regard to its structure and substitution by $^1$H-NMR, and in regard to its molecular weight by GPC.

Yield: 20 g;
Weight average molecular weight: 14,500;
Molecular weight distribution: 2.55;
Substitution analysis by $^1$H-NMR: l=0.46, m=0.27, n=0.27

Formula 12

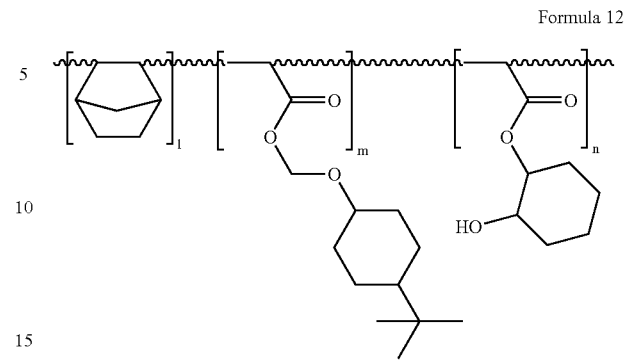

SYNTHESIS EXAMPLE 10

The producers were performed in the same manner as described in the Synthesis Example 1, excepting that 35.6 g of methyl cyclopentanyl acrylate and 4.2 g of acrylic acid were used instead of methyl acrylate. The final product was a polymer represented by the following Formula 13. The polymer thus obtained was analyzed in regard to its structure and substitution by $^1$H-NMR and in regard to its molecular weight by GPC.

Yield: 27 g;
Weight average molecular weight: 11,500;
Molecular weight distribution: 2.35;
Substitution analysis by $^1$H-NMR: l=0.46, m=0.44, n=0.10

Formula 13

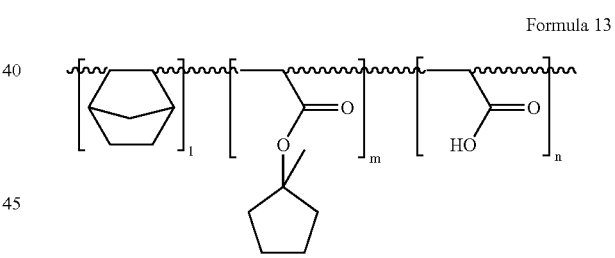

SYNTHESIS EXAMPLE 11

The producers were performed in the same manner as described in the Synthesis Example 6, excepting that 27.6 g of 3-bicyclo[2,2,1]hept-5-en-2-yl-3-hydroxy-propionic-acid t-butyl ester (hereinafter, referred to as "BHP") was used as a monomer instead of t-butyl acrylate. The final product was a polymer represented by the following Formula 14. The polymer thus obtained was analyzed in regard to its structure and substitution by $^1$H-NMR and in regard to its molecular weight by GPC.

Yield: 34 g;
Weight average molecular weight: 5,400;
Molecular weight distribution: 1.85;
Substitution analysis by $^1$H-NMR: l=0.52, m=0.34, n=0.14

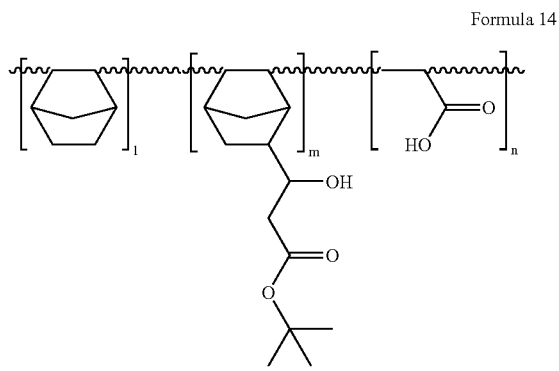

Formula 14

SYNTHESIS EXAMPLE 12

The producers were performed in the same manner as described in the Synthesis Example 1, excepting that 25.7 g of hexafluoroisopropyl acrylate and 8.4 g of acrylic acid were used instead of methyl acrylate. The final product was a polymer represented by the following Formula 15. The polymer thus obtained was analyzed in regard to its structure and substitution by $^1$H-NMR and in regard to its molecular weight by GPC.

Yield: 30 g;
Weight average molecular weight: 11,600;
Molecular weight distribution: 2.21;
Substitution analysis by $^1$H-NMR: l=0.43, m=0.28, n=0.29

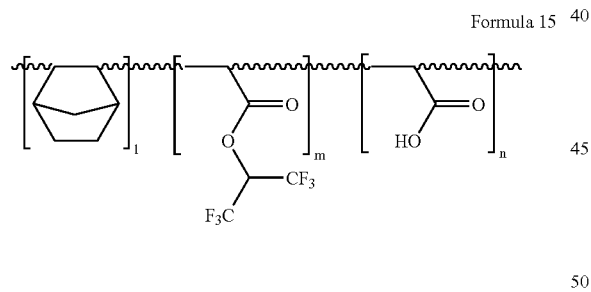

Formula 15

SYNTHESIS EXAMPLE 13

The producers were performed in the same manner as described in the Synthesis Example 8, excepting that 48.7 g of styrene was used instead of norbomene. The final product was a polymer represented by the following Formula 16. The polymer thus obtained was analyzed in regard to its structure and substitution by $^1$H-NMR and in regard to its molecular weight by GPC.

Yield: 26 g;
Weight average molecular weight: 11,700;
Molecular weight distribution: 2.23;
Substitution analysis by $^1$H-NMR: l=0.05, m=0.43, n = 0.42

Formula 16

SYNTHESIS EXAMPLE 14

The producers were performed in the same manner as described in the Synthesis Example 13, excepting that 14.9 g of t-butyl acrylate was used instead of t-butyl cyclohexyl methoxy acrylate. The final product was a polymer represented by the following Formula 17. The polymer thus obtained was analyzed in regard to its structure and substitution by $^1$H-NMR and in regard to its molecular weight by GPC.

Yield: 20 g;
Weight average molecular weight: 11,150;
Molecular weight distribution: 2.45;
Substitution analysis by $^1$H-NMR: l=0.08, m=0.42, n=0.40

Formula 17

SYNTHESIS EXAMPLE 15

The producers were performed in the same manner as described in the Synthesis Example 13, excepting that 27.8 g of 1,4-cyclohexyl vinyl ether was used instead of styrene. The final product was a polymer represented by the following Formula 18. The polymer thus obtained was analyzed in regard to its structure and substitution by $^1$H-NMR and in regard to its molecular weight by GPC.

Yield: 26.5 g;
Weight average molecular weight: 11,750;
Molecular weight distribution: 2.35;
Substitution analysis by $^1$H-NMR: l=0.15, m=0.4, n=0.45

Formula 18

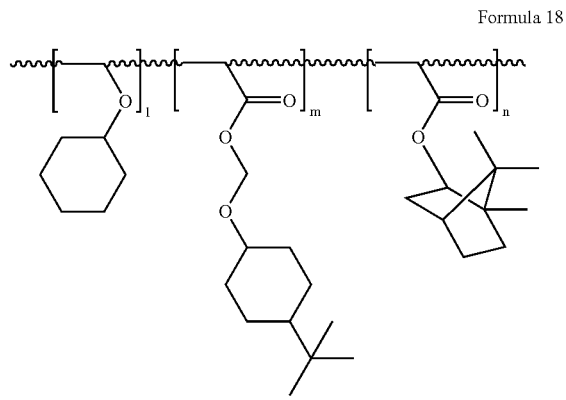

SYNTHESIS EXAMPLE 16

The producers were performed in the same manner as described in the Synthesis Example 15, excepting that 79.6 g of 1,4-cyclohexane dimethanol vinyl ether was used instead of 1,4-cyclohexyl vinyl ether. The final product was a polymer represented by the following Formula 19. The polymer thus obtained was analyzed in regard to its structure and substitution $^1$H-NMR and in regard to its molecular weight by GPC.

Yield: 52 g;
Weight average molecular weight: 11,200;
Molecular weight distribution: 2.15;
Substitution analysis by $^1$H-NMR: l=0.13, m=0.38, n=0.49

Formula 19

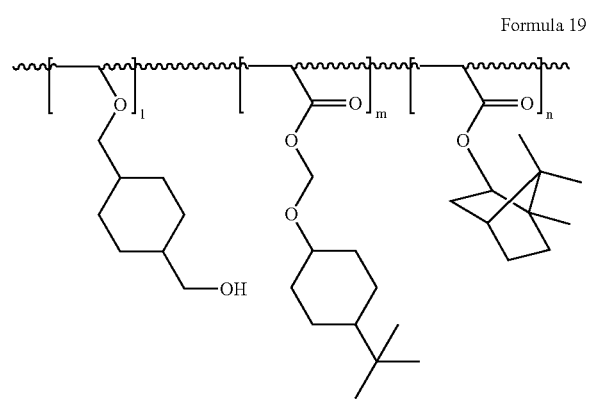

SYNTHESIS EXAMPLE 17

Figure 8:
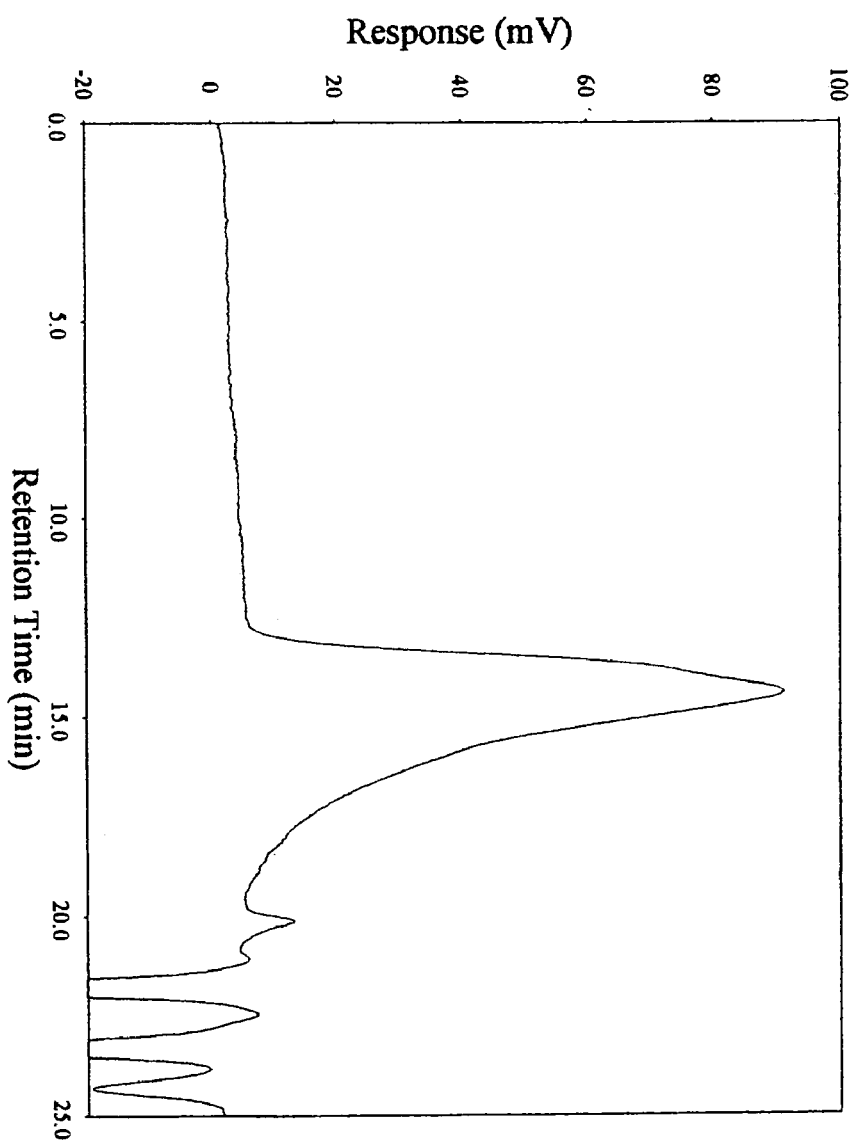
FIG. 8 is a GPC of the compound represented by the Formula 20.

The producers were performed in the same manner as described in the Synthesis Example 3, excepting that 128 g of 1,1'-di(trifluoromethyl)-2-norbornenyl-1-ol was used instead of norbornene. The final product was a polymer represented by the following Formula 20. The polymer thus obtained was analyzed in regard to its structure and substitution by $^1$H-NMR and in regard to its molecular weight by GPC. The results are presented in FIG. 8.

Yield: 62 g;
Weight average molecular weight: 13,700;
Molecular weight distribution: 2.31;
Substitution analysis by $^1$H-NMR: l=0.36, m=0.64

Formula 20

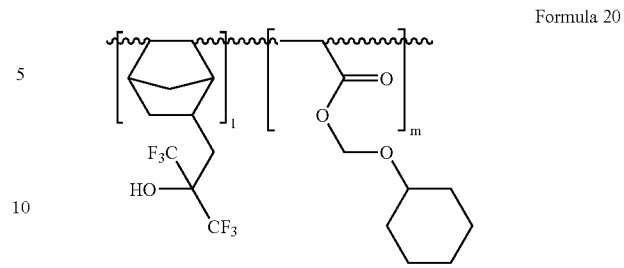

<Fabrication and Appraisal of Resist>

EXAMPLE 1

Based on 100 parts by weight of the resin obtained in the Synthesis Example 7, 1.2 part by weight of triphenyl sulfonium nonaplate as a photoacid generator, 0.02 part by weight of tetramethylammonium hydroxide as a basic additive, and 15 parts by weight of a lower molecule additive (the compound denoted by Add-I in Table 1) were dissolved in 550 parts by weight of propylene glycol methyl ether acetate, and the mixture was filtered through a 0.2 μm-thickness membrane filter to prepare a resist solution.

The resist solution thus obtained was coated on a substrate with a spinner and dried at 110° C. for 90 seconds to form a 0.3 μm-thickness coating film. The film thus obtained was subjected to exposure with an ArF Excimer laser stepper and then annealed at 130° C. for 90 seconds. Subsequently, the film was developed with an aqueous solution containing 2.38 wt. % of tetramethylammonium hydroxide for 60 seconds, washed out, and dried to form a resist pattern.

The resist pattern thus obtained was good in developability with an aqueous solution of tetramethylammonium hydroxide and adhesiveness to the substrate, with a resolution of 0.12 μm and a sensitivity of 15 mJ/cm$^2$.

For adhesiveness, the adhesive condition of the 0.18 μm line end space (L/S) pattern formed after development was observed and evaluated as "bad" for a bad condition such as exfoliation or scouring, and as "good" for no bad condition shown.

For sensitivity, the amount of exposure light that forms a one-to-one line width of the 0.18 μm line end space (L/S) pattern formed after development was defined as an optimal amount of exposure light. In this case, the sensitivity was the optimal amount of exposure light, and the resolution was the corresponding minimum pattern size after development.

The measurement results are presented in Table 1.

EXAMPLES 2 TO 10

Each polymer of the Synthesis Examples 6, 8 and 10, a photoacid generator, a basic additive, and a lower molecule additive were dissolved in 550 parts by weight of propylene glycol methyl ether acetate. The resulting solution was filtered with a 0.2 μm membrane filter to prepare a resist composition represented in Table 1 (the "part" means "part by weight").

The procedures were performed to form a positive resist pattern from each composition solution in the same manner of the Example 1, excepting that an ArF Excimer laser exposure device (the number of lens openings is 0.60) was used. Then, various tests for the resist pattern were performed. The results are presented in Table 1.

The resist pattern obtained in each example was good in adhesiveness and developability. The resist pattern, after being heated on a hot plate at 130° C. to observe its deformation, showed no deformation and excellent heat resistance.

TABLE 1

| Example | Resin (part) | PAG (part) | Base (part) | Additive (part) | Adhesiveness | Standing wave | Sensitivity (mJ/cm$^2$) | Resolution (nm) |
|---|---|---|---|---|---|---|---|---|
| 1 | P4(400) | 1.2 | 0.02 | Add-I (15) | Good | None | 15 | 120 |
| 2 | P1(100) | 1.6 | 0.03 | Add-I (10) | Good | None | 14.5 | 120 |
| 3 | P2(100) | 1.6 | 0.03 | Add-I (15) | Good | None | 14.5 | 130 |
| 4 | P3(100) | 1.6 | 0.03 | Add-I (20) | Good | None | 15 | 140 |
| 5 | P1(100) | 1.9 | 0.03 | Add-II (10) | Good | None | 12.5 | 120 |
| 6 | P2(100) | 1.9 | 0.03 | Add-II (15) | Good | None | 13 | 130 |
| 7 | P3(100) | 1.9 | 0.03 | Add-II (20) | Good | None | 13 | 130 |
| 8 | P1(100) | 1.6 | 0.05 | Add-III (10) | Good | None | 17 | 140 |
| 9 | P2(100) | 1.6 | 0.05 | Add-III (15) | Good | None | 16.5 | 130 |
| 10 | P3(100) | 1.6 | 0.05 | Add-III (20) | Good | None | 17.5 | 140 |

P1: Polymer of Formula 9
P2: Polymer of Formula 11
P3: Polymer of Formula 13
P4: Polymer of Formula 10
PAG: photoacid generator - triphenylsulfonium nonaplate
Base: Tetramethylammonium hydroxide
Add-I, Add-II and Add-III:

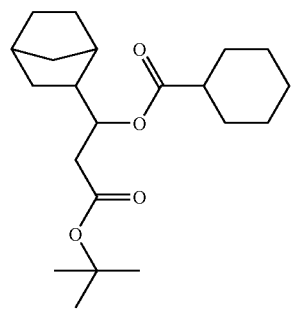

Add-I

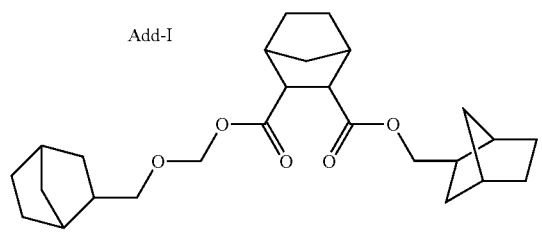

Add-II

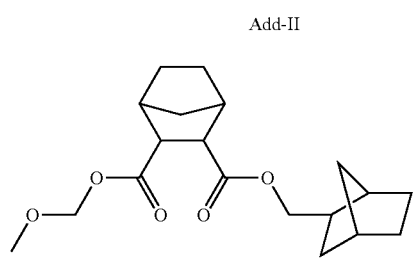

Add-III

As described above in detail, the chemically amplified resist containing a polymer comprising an olefin and an acrylate according to the present invention can form a resist pattern that is excellent in adhesiveness with a low dependency to the substrate, transparency at the far ultraviolet wavelength range such as KrF Excimer laser or ArF Excimer laser, dry etch resistance, sensitivity, resolution, and developability. In addition, the polymer contains a maximum number of saturated aliphatic rings to enhance etching resistance, and additionally includes an alkoxyalkyl acrylate monomer introduced as a solution to the problem with the conventional polyacrylate resist in regard to edge roughness of the pattern, to form a uniform edge of the pattern because the alkylalcohol compound generated together with a formaldehyde and a carboxylate compound by a deprotection reaction of the alkoxyalkyl acrylate monomer with an acid acts as a solvent or an antifoaming agent in the pattern.

What is claimed is:

1. A polymer consisting essentially of repeating units l, m, and n represented by Formula 1:

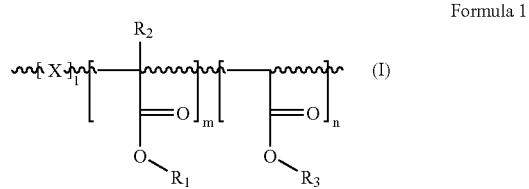

Formula 1 wherein

X is one group selected from the group consisting of a $C_3$-$C_{30}$ vinyl ether derivative, a $C_3$-$C_{30}$ maleic anhydride derivative, and a $C_3$-$C_{30}$ olefin derivative not having at a double bond position of the $C_3$-$C_{30}$ olefin derivative an electron withdrawing group selected from the group consisting of a halogen group, a nitrile group (—CN), a nitro group (—$NO_2$), a trifluoromethyl group (—$CF_3$) and a sulfon group (—$SO_2$);

$R_1$ and $R_3$ are independently selected from the group consisting of hydrogen, $C_1$-$C_{30}$ alkyl, $C_1$-$C_{30}$ alkoxyalkyl, $C_1$-$C_{30}$ halogen-substituted alkyl, and $C_1$-$C_{30}$ halogen-substituted alkoxyalkyl;

$R_2$ is trifluoromethyl; and wherein the repeat unit l comprises from about 5 to about 70 mole % of the polymer, the repeat unit m comprises from about 20 to about 70 mole % of the polymer, and the repeat unit n comprises from about 10 to about 70 mole % of the polymer, and l+m+n=100%.

2. A chemically amplified resist composition comprising a polymer consisting essentially of repeating units l, m, and n represented by Formula 1, a photoacid generator, and a solvent:

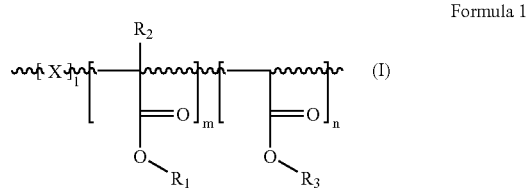

Formula 1 wherein

X is one group selected from the group consisting of a $C_3$-$C_{30}$ vinyl ether derivative, a $C_3$-$C_{30}$ maleic anhydride derivative, and a $C_3$-$C_{30}$ olefin derivative not having at a double bond position of the $C_3$-$C_{30}$ olefin derivative an electron withdrawing group selected from the group consisting of a halogen group, a nitrile group (—CN), a nitro group (—$NO_2$), a trifluoromethyl group (—$CF_3$) and a sulfon group (—$SO_2$);

$R_1$ and $R_3$ are independently selected from the group consisting of hydrogen, $C_1$-$C_{30}$ alkyl, $C_1$-$C_{30}$ alkoxyalkyl, $C_1$-$C_{30}$ halogen-substituted alkyl and $C_1$-$C_{30}$ halogen-substituted alkoxyalkyl;

$R_2$ is trifluoromethyl; and wherein the repeat unit l comprises from about 5 to about 70 mole % of the polymer, the repeat unit m comprises from about 20 to about 70 mole % of the polymer, and the repeat unit n comprises from about 10 to about 70 mole % of the polymer, and l+m+n =100%.

3. The chemically amplified resist composition as claimed in claim 2, wherein the photoacid generator is selected from the following compounds:

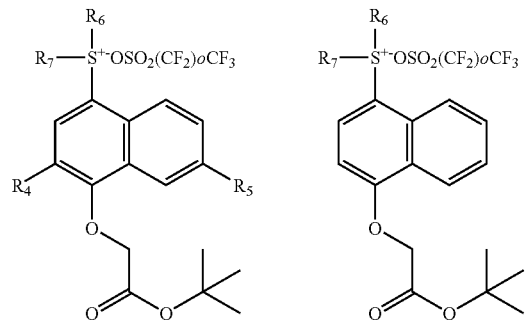

wherein $R_6$ and $R_7$ are independently alkyl, aryl, perfluoroalkyl, benzyl, or allyl;

$R_4$ and $R_5$ are independently hydrogen, alkyl, halogen, alkoxy, aryl, thiophenoxy, thioalkoxy, or alkoxycarbonylmethoxy; and o is an integer from 1 to 8.

4. The chemically amplified resist composition as claimed in claim 2, wherein the photoacid generator is included in an amount of 0.1 to 30 parts by weight based on 100 parts by weight of the polymer.

5. The chemically amplified resist composition as claimed in claim 2, wherein the polymer represented by the Formula 1 is included in an amount of at least 3 wt. % with respect to the total weight of the resist composition.

* * * * *